US005560780A

United States Patent [19]

Wu et al.

[11] Patent Number: 5,560,780
[45] Date of Patent: Oct. 1, 1996

[54] PROTECTIVE COATING FOR DIELECTRIC MATERIAL ON WAFER SUPPORT USED IN INTEGRATED CIRCUIT PROCESSING APPARATUS AND METHOD OF FORMING SAME

[75] Inventors: Robert Wu, Pleasanton; Jian Ding, San Jose, both of Calif.

[73] Assignee: Applied Materials, Inc., Santa Clara, Calif.

[21] Appl. No.: 420,620

[22] Filed: Apr. 12, 1995

Related U.S. Application Data

[63] Continuation of Ser. No. 52,018, Apr. 22, 1993, abandoned.
[51] Int. Cl.⁶ .................... C23C 16/00; B25B 11/00; H01H 3/00; H01G 3/00
[52] U.S. Cl. .................... 118/728; 361/234; 269/8
[58] Field of Search .................... 118/728; 361/234; 269/8

[56] References Cited

U.S. PATENT DOCUMENTS

| | | | |
|---|---|---|---|
| 4,384,918 | 5/1983 | Abe | 156/643 |
| 4,480,284 | 10/1984 | Tojo et al. | 361/234 |
| 4,645,218 | 2/1987 | Ooshio et al. | 361/234 |
| 4,665,463 | 5/1987 | Ward et al. | 361/234 |
| 4,832,781 | 5/1989 | Mears | 156/345 |
| 5,055,964 | 10/1991 | Logan et al. | 361/234 |
| 5,104,834 | 4/1992 | Watanabe et al. | 501/127 |
| 5,151,845 | 9/1992 | Watanabe et al. | 361/234 |
| 5,166,856 | 11/1992 | Liporace et al. | 361/234 |
| 5,191,506 | 3/1993 | Logan et al. | 361/234 |
| 5,250,137 | 10/1993 | Arami et al. | 118/723 |
| 5,275,683 | 1/1994 | Arami et al. | 156/345 |
| 5,280,156 | 1/1994 | Niori et al. | 118/725 |
| 5,284,549 | 2/1994 | Barnes et al. | 156/662 |
| 5,290,609 | 3/1994 | Horiike et al. | 427/576 |
| 5,306,895 | 4/1994 | Ushikoshi et al. | 219/385 |
| 5,324,053 | 6/1994 | Kubota et al. | 361/234 |
| 5,350,479 | 9/1994 | Collins et al. | 156/345 |
| 5,382,469 | 1/1995 | Kubota et al. | 428/332 |

FOREIGN PATENT DOCUMENTS

| | | | |
|---|---|---|---|
| 0439000 | 1/1991 | European Pat. Off. | H02N 13/00 |
| 0439000A1 | 7/1991 | European Pat. Off. . | |
| 0486966 | 11/1991 | European Pat. Off. | H02N 13/00 |
| 0452222 | 4/1990 | France | H01L 21/00 |
| 2-27748 | 1/1990 | Japan | H01L 21/68 |
| 3102814 | 4/1991 | Japan . | |
| 3152953 | 6/1991 | Japan | H01L 21/68 |
| 4054880 | 2/1992 | Japan | H02N 13/00 |
| 4146639 | 5/1992 | Japan | H01L 21/283 |
| 4-367247 | 12/1992 | Japan . | |
| 5304201 | 11/1993 | Japan | B23Q 3/15 |
| 6177231 | 6/1994 | Japan | B23Q 3/15 |
| 6291175 | 10/1994 | Japan | B23Q 3/15 |

OTHER PUBLICATIONS

Document 93021512A–MIN, "Electrostatic Chuck (ESC) Working Group Meeting #2 Minutes", *Sematech*, Feb. 3, 1993, pp. 1–26.

(List continued on next page.)

*Primary Examiner*—Mary Wilczewski
*Assistant Examiner*—Brian K. Dutton
*Attorney, Agent, or Firm*—John P. Taylor

[57] ABSTRACT

Improvements in a wafer support apparatus used for electrostatic clamping of a wafer to the wafer support, and a method of making same, are disclosed wherein a dielectric material, formed on the surface of a wafer support facing the wafer to facilitate the electrostatic clamping, has a protective coating formed over the dielectric material to provide protection to the dielectric material against chemical attack from chemicals used during the processing of the semiconductor wafer. In a preferred embodiment, the protective coating comprises an aluminum compound, such as an oxide of aluminum or aluminum nitride, having a thickness ranging from about 1 micron to about 30 microns, but not exceeding about 50% of the thickness of the dielectric material so as to not interfere with the electrostatic charge used for clamping the wafer to the wafer support.

24 Claims, 1 Drawing Sheet

OTHER PUBLICATIONS

Document 94092528A–ENG, "SETEC/Sandia Dielectric Coatings for Electrostatic Chucks (ESCs) Report", *Sematech*, Sept. 30, 1994, pp. 1–25.

Document 94092535A–XFR, "SETEC/Sandia Dielectric Coatings for Electrostatic Chucks (ESCs) Appendix", *Sematech*, Oct. 10, 1994, pp. 1–23.

Watanabe, Toshiya, et al., "Relationship between Electrical Resistivity and Electrostatic Force of Alumina Electrostatic Chuck", *Jpn. J. Appl. Phys.*, vol. 32, Pt. 1, No. 2, 1993, pp. 864–871.

Watanabe, Toshiya, et al., "Resistivity and Microstructure of Alumina Ceramics Added with $TiO_2$ Fired in Reducing Atmosphrere", *Journal of the Ceramic Society of Japan, Int. Edition*, vol. 101, No. 10, 1993, pp. 1076–1083.

Nakasuji, Mamoru, et al., "Low Voltage and High Speed Operating Electrostatic Wafer Chuck", *J. Vac.Sci. Technol. A*, vol. 10, No. 6 Nov./Dec., 1992, pp. 3573–3578.

Nakasuji, Mamoru, et al., "Low Voltage and High Speed Operating Electrostatic Wafer Chuck Using Sputtered Tantalum Oxide Membrane", *J. Vac.Sci. Technol. A*, vol. 12, No. 5, Sep./Oct., 1994, pp. 2834–2839.

Watanabe, Toshiya, et al., "Effect of Additives on the Electrostatic Force of Alumina Electrostatic Chucks", *Journal of the Ceramic Society of Japan*, vol. 100, No. 1, 1992, pp. 1–6.

Watanabe, Toshiya, et al., "Electrostatic Force and Absorption Current of Alumina Electrostatic Chuck", *Jpn. J. Appl. Phys.*, vol. 31, Part I, No. 7, Jul., 1992.

PROTECTIVE COATING FOR DIELECTRIC MATERIAL ON WAFER SUPPORT USED IN INTEGRATED CIRCUIT PROCESSING APPARATUS AND METHOD OF FORMING SAME

This is a continuation of application Ser. No. 08/052,018 filed on Apr. 22, 1993, and now abandoned.

BACKGROUND OF THE INVENTION

1. Field of the Invention

This invention relates to a protective coating formed over a dielectric layer, used for electrostatically clamping a semiconductor wafer to a wafer support in integrated circuit processing apparatus, to protect the dielectric layer from chemical attack; and the method of protecting the dielectric layer.

2. Description of the Related Art

In the processing of semiconductor wafers in a sealed chamber to form integrated circuit structures thereon, the semiconductor wafer is normally positioned on a wafer support within the chamber. To secure the wafer to the support, and in particular to prevent movement of the wafer (either vertically or laterally) during processing, it has been customary to physically clamp the wafer to the underlying support.

More recently however, other means for securing the wafer to the support have been explored and adopted due to various problems, such as particle formation, mechanical stress, etch profiles, etc., which have been experienced with the use of mechanical force to secure the wafer to the support.

One such wafer securement means, commonly referred to as electrostatic clamping, utilizes an electrostatic charge on the surface of a dielectric material formed over the portion of the metal wafer support facing the wafer, i.e., between the undersurface of the wafer and the facing surface of the underlying metal wafer support. Such electrostatic clamping is described, for example, in Abe U.S. Pat. No. 4,384,918; Japan Patent Document 2-27748; and in "Electrostatic Force and Absorption Current of Alumina Electrostatic Chuck", published by Watanabe et al. in Jpn. Journal of Applied Physics, Vol. 31 (1992) at pages 2145–2150.

While this type of wafer securement, utilizing electrostatic clamping, has proved to be successful in eliminating the previous problems encountered in the mechanical clamping of the wafer to the wafer support, corrosion problems have been encountered because the dielectric materials which provide the most satisfactory performance in the use of electrostatic clamping to secure the wafer to the wafer support do not exhibit sufficient resistance to some of the chemicals used during the processing of the semiconductor wafer in the chamber.

In particular, when a polyimide material is provided, as the dielectric material, on the top surface of the metal wafer support, it has been found that such polyimide material is susceptible to chemical attack by $O_2$ gas, used for in situ cleaning of the chamber after etching. The polyimide material has also been found to be subject to chemical attack by fluorine-containing gases as well, although to a lesser extent than the vulnerability to $O_2$ attack.

It therefore would be desirable to provide protection against chemical attack for the dielectric material, formed on the surface of the metal wafer support for the purpose of electrostatic clamping of a semiconductor wafer to the wafer support, without however, interfering with the electrostatic charge on the surface of the dielectric material.

SUMMARY OF THE INVENTION

The invention comprises an improvement in the field of electrostatically clamping a semiconductor wafer to a wafer support having a dielectric material formed on the surface thereof facing the wafer, wherein the improvement comprises a protective coating formed over the dielectric surface to provide protection to the dielectric material against chemical attack from chemicals used during the processing of the semiconductor wafer; and a method for protecting the dielectric material by forming the protective layer over the dielectric material in a manner which will not interfere with the formation of a sufficient electrostatic charge on the coated wafer support surface facing the wafer to secure the wafer to the wafer support without either vertical or lateral movement of the wafer during processing.

DETAILED DESCRIPTION OF THE INVENTION

Figure 1:
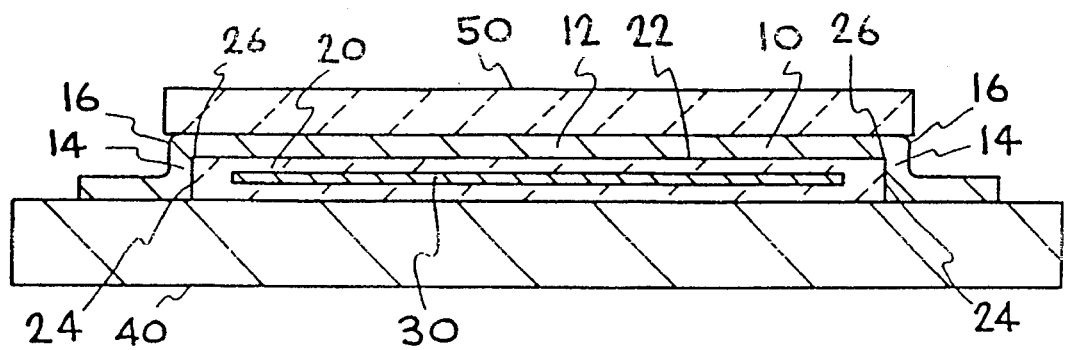
FIG. 1 is a vertical cross-sectional view of a wafer support showing the dielectric layer formed on the wafer support surface thereon, and a protective layer formed over the exposed surfaces of the dielectric material, in accordance with the invention.

The invention comprises a protective coating formed over a dielectric material provided on a wafer support in a semiconductor wafer processing apparatus to electrostatically clamp the wafer to the support; and a method of forming the protective coating over the dielectric material without interfering with the desired electrostatic clamping of the wafer to the wafer support.

The dielectric material to be protected may comprise any non-conductive material formed over a conductive surface in order to store the desired electrostatic charge thereon. The invention, however, is particularly directed to polymeric dielectric materials such as, for example, polyimide, since such materials, while forming good dielectric materials, are subject to attack by the processing used in the formation of integrated circuit structures on the wafer.

The protective coating formed over the dielectric material basically must comprise a material capable of providing the desired protection of the dielectric material against chemical attack by chemicals used to process the semiconductor wafer, without interfering with the desired electrostatic clamping provided by the dielectric material. The protective material must also be compatible with the various processes carried out in the apparatus containing the wafer support during the course of forming integrated circuit structures on the semiconductor wafer, e.g., not react with, nor interfere with the chemicals used in the processing of the semiconductor wafer.

The protective coating formed over the dielectric material must be rather thin so as to not interfere with the establishment of the desired electrostatic charge on the dielectric surface facing the wafer. It has been found that the strength of this electrostatic chucking force is inversely proportional to the square of the thickness of the dielectric material. In general it has been found that the thickness of the protective coating should not exceed about 50% of the thickness of the dielectric material to be protected, and preferably not exceed about 10% of the dielectric material, to ensure that the protective coating is not so thick that it interferes with the electrostatic charge formed on the surface over the dielectric layer. Usually the protective coating need not exceed about 30 microns to provide the desired chemical protection, and preferably the protective coating will not exceed about 10 microns in thickness.

The protective coating should also be uniform in thickness, both for the desired chemical protection and for uniformity of the electrostatic charge strength through the coating from the underlying dielectric material. Furthermore, the coating should be conformal, with respect to uniformity of coating thickness, not only over the flat surface portions of the wafer support and dielectric surface thereon, but also at corners as well. By uniform in thickness is meant that the thickness of a given protective coating does not vary by more than about ±5% from the mean thickness, using a typical 9 point measurement pattern. It should be noted that if necessary, the sharpness of the corners of the underlying dielectric material may be rounded or slanted, if desired, to achieve the desired uniformity of the thickness of the protective coating layer.

As stated above, the protective coating must be capable of withstanding chemical attack by processing materials such as etch materials used in processing the semiconductor wafer. In particular, the protective coating must be capable of providing protection to the underlying dielectric material from attack by etchants such as $O_2$-containing etchants or fluorine-containing etchants. Generally a minimum thickness of the protective coating of at least about 1 micron, and preferably about 3 microns, will ensure a sufficient thickness to provide the desired degree of protection for the underlying dielectric material. However, not only is a minimum and uniform thickness of protective coating required, but there also must be an absence of any pinholes or openings in the protective coating. By an absence of any pinholes is meant that no pinholes are visible to inspection of the protective coating by scanning electron microscopy (SEM).

As a further requirement of the protective coating, the thermal coefficient of expansion of the protective coating must sufficiently match, or be compatible with, both the dielectric material and the metal support on which the dielectric material is formed, up to a temperature of about 150° C., so as to avoid cracking or the inducement of mechanical stresses in the underlying dielectric material. By "sufficiently match" is meant that the thermal coefficient of expansion of the protective coating does not vary from either the thermal coefficient of expansion of said wafer support or the thermal coefficient of expansion of the dielectric material by more than about 20%.

The protective coating must also be physically strong enough to resist particle penetration by any particles which may be normally encountered in normal semiconductor wafer processing. That is, the protective coating must be capable of providing mechanical protection to the dielectric material which may be soft and therefore susceptible to particle penetration. While the formation of the dielectric material on the wafer support, and the formation of an electrostatic charge on the wafer support thereby, form no part of the instant invention, one manner in which the desired electrostatic charge is formed on the surface of the dielectric material is by the provision of a metal electrode embedded in the dielectric material. If a particle should penetrate into the dielectric material sufficiently to contact such a buried electrode, such formation of the desired electrostatic charge could be impeded. The protective layer thus should be capable of affording mechanical protection against such penetration, as well as providing the desired chemical protection.

Finally, the protective coating should be sufficiently conductive to permit release of the electrostatic charge when the wafer is to be removed from the wafer support, yet sufficiently insulative to hold the electrostatic charge on the surface during the clamping or chucking of the wafer to the wafer support. Usually a protective material having a resistivity ranging from about $10^{13}$ ohm centimeters ($\Omega$ cm.) to about $10^{20}$ $\Omega$ cm. will be found to be satisfactory from a standpoint of conductivity versus resistivity.

When the metal wafer support on which the dielectric material is mounted comprises an aluminum material, it has been found that an inorganic aluminum compound, such as an oxide of aluminum (e.g., $Al_2O_3$) or aluminum nitride (AlN) formed to a thickness ranging from about 1 micron to about 30 microns, and preferably to a thickness of from about 3 microns to about 20 microns, and not exceeding about 50% of the thickness of the dielectric material, will meet all of the above requirements.

The protective coating may be formed over the dielectric material and exposed areas of the wafer support by a deposition process such as an ion-assisted (E-beam) evaporation process, or by a plasma spray process, or by a CVD process. Preferably, during the deposition of the protective coating, the wafer support and dielectric material thereon are located or positioned above the protective material source to prevent or at least inhibit the deposition of any particles on the dielectric material and/or wafer support during deposition of the protective material. By way of illustration, and not of limitation, when an ion-assisted evaporation process is used to deposit the protective mating over the wafer support and dielectric material thereon, the beam power may be several kW; the wafer support to be coated may be located about 20 inches from the coating source being evaporated by the beam; the temperature may range from about room temperature up to about 150° C.; the pressure may be as low as possible, preferably ranging from about 0.1 to about 1 Torr; and the time may vary from about 1 to about 24 hours, depending on the temperature and beam power level. Referring now to FIG. 1, the protective coating of the invention is shown at 10 covering the exposed surfaces of a dielectric material 20, which may have an electrode 30 therein to assist in the desired generation of an electrostatic charge on the surface of dielectric material 20. Dielectric material 20 is, in turn, secured to a surface of a metallic wafer support 40 which conventionally may comprise aluminum or an aluminum alloy, i.e., an alloy containing at least about 50 wt. % aluminum. The structure is further shown, for illustrative purposes only, having a wafer 50 thereon, it being understood that the wafer is not present while the protective coating 10 is being formed over dielectric material 20 and metallic wafer support 40. It will be understood that the relative thicknesses of the materials shown in the drawings is not to scale, with the thickness of some of the materials exaggerated for illustrative purposes only.

As previously discussed, protective coating 10 should comprise a material capable of forming a conformal coating over the surfaces of dielectric material 20. In particular, portion 12 of protective coating 10, formed over the flat surface 22 of dielectric layer 20 to which wafer 50 will adhere due to the electrostatic charge thereon, should be approximately the same thickness as portion 14 of protective coating formed on the end edges 24 of dielectric material 20 and the protective coating portion 16 formed over the corners 26 of dielectric material 20. Such a conformal coating of dielectric material 20 by protective coating material 10 will result in a uniformity of the desired chemical protection, as well as permitting a uniform charge distribution of the electrostatic charge across the surfaces contacted by wafer 50.

Figure 2:
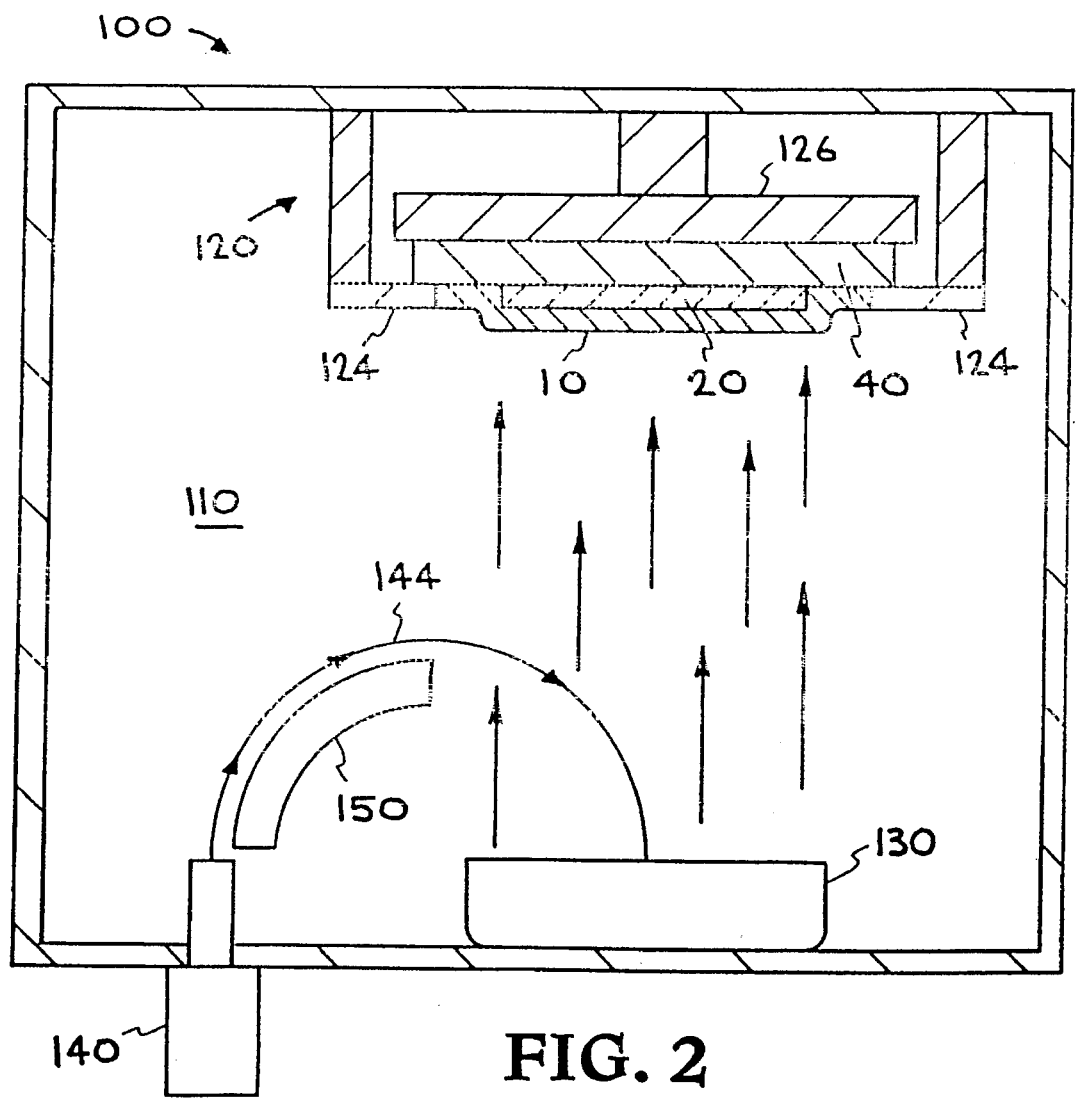
FIG. 2 is a pictorial side view of an apparatus which may be used in forming the protective coating over the dielectric material on the wafer support.

Now referring to FIG. 2, a typical apparatus 100 which can be used for the formation of protective coating 10 on dielectric material 20 and metal wafer support 40 is illustrated. In the illustrated embodiment, apparatus 100 comprises an ion assisted (E-beam) type deposition apparatus having a deposition chamber 110 with a clamping mechanism 120 therein comprising a pedestal 126 with clamping fingers 124 which will engage the peripheral portion of metallic wafer support 40 not covered by dielectric material 20 to urge wafer support 40 against pedestal 126. Preferably, as shown, clamping mechanism 120 will be located or positioned adjacent the top of chamber 110 to avoid any particle deposition onto dielectric material 20, as previously discussed.

Located adjacent the bottom of chamber 110 is a containment vessel, such as illustrated crucible 130, containing the protective material, e.g., $Al_2O_3$ or AlN, to be coated over the exposed surfaces of dielectric material 20 and metallic wafer support 40. Also shown mounted to the bottom of chamber 110 is a charged particle beam source 140 from which an electron or ion beam 144 may be generated and projected into chamber 110. In the illustrated embodiment, magnetic deflection means 150 within chamber 110 deflect beam 144 toward and into crucible 130 to thereby strike and vaporize the protective material therein.

By way of illustration, a 196 millimeter (mm) diameter aluminum wafer support, having a 50 micrometer (μm) thick polyimide layer formed thereon, was coated, in accordance with the invention, with a 4 μm thick protective coating of aluminum oxide. The aluminum oxide coating was deposited by evaporating aluminum oxide from a crucible placed 20 inches beneath the wafer support and dielectric material thereon in a chamber maintained at a temperature of about 100° C. and at a pressure of about $10^{-5}$ Torr. The aluminum oxide was evaporated from the crucible and coated over the dielectric material for a period of about 12 hours, using a ion beam at a power level of about 1.5 kW.

The resulting aluminum oxide protective coating was examined for pinholes under SEM and none were found. To test the coating deposited over the wafer support and dielectric material, the structure was exposed to an $O_2$ gas plasma for about 8 hours at an average temperature of about 90° C. The structure was then examined for chemical attack on the underlying polyimide dielectric material. None was found.

The uniformity of the protective coating was also determined by optical nanospec, using a dummy coating (a coating not on an actual polyimide layer), and found to have a thickness variation of less than about 2–3% from the thickest portion to the thinnest portion.

To further test the protective coating, a number of semiconductor wafers were sequentially electrostatically clamped to a semiconductor wafer support mounted in an etch chamber and having a dielectric material affixed to the surface facing the wafer. The wafer support was provided with a protective coating over the dielectric material, in accordance with the invention. After conducting a normal oxide etch on 12 wafers, each of the wafers were examined and found to have not moved during the etch, indicating that the electrostatic clamping had not been adversely affected by formation of the protective coating over the dielectric material. The protective coating on the wafer support was then further examined after such processing for any signs of cracking, indicative of thermal mismatching between the protective coating and the underlying dielectric material and wafer support. None was found. Nor was there any sign of particle impaction damage to the protected dielectric material. Finally, the dielectric material on the wafer support was examined for any indication of chemical attack and none was found.

Thus, the invention provides an improved wafer support utilizing electrostatic clamping wherein the dielectric material, formed on the wafer support in connection with the electrostatic charge utilized in such electrostatic clamping, is protected from chemical attack by chemicals, used in the processing of a semiconductor wafer, in a manner wherein the electrostatic clamping of the wafer is not impaired.

Having thus described the invention what is claimed is:

1. In a semiconductor wafer processing apparatus wherein an aluminum wafer support has a polymeric dielectric material formed thereon to permit electrostatic clamping of a semiconductor wafer to said wafer support by electrostatic charges, the improvement which comprises: a protective coating of an inorganic aluminum compound of uniform thickness formed over at least portions of said polymeric dielectric material to protect said polymeric dielectric material from attack by chemicals used in processing said semiconductor wafer.

2. The apparatus of claim 1 wherein said protective coating has a maximum thickness which does not exceed about 50% of the thickness of said polymeric dielectric material.

3. The apparatus of claim 2 wherein said protective coating has a maximum coating thickness not exceeding about 30 microns.

4. The apparatus of claim 3 wherein said protective coating is uniform in thickness over said polymeric dielectric material to provide uniformity in the strength of said electrostatic charges exerted on said semiconductor wafer.

5. The apparatus of claim 3 wherein the thermal coefficient of expansion of said protective coating:

a) does not vary from the thermal coefficient of expansion of said wafer support by more than about 5%; and b) does not vary from the thermal coefficient of expansion of said dielectric material by more than about 5%.

6. The apparatus of claim 3 wherein said protective coating has a minimum coating thickness of at least about 1 micron.

7. The apparatus of claim 3 wherein said protective coating has a minimum coating thickness of at least about 3 microns.

8. The apparatus of claim 3 wherein said protective coating is capable of protecting said dielectric material against penetration of said protective coating by particles during processing of said semiconductor wafer.

9. The apparatus of claim 3 wherein said protective coating has a resistivity ranging from about $10^{13}$ cm. to about $10^{20}$ Ω cm. to permit holding of said electrostatic charges thereon during said electrostatic clamping of said wafer and release of said semiconductor electrostatic charges when said wafer is to be removed from said wafer support.

10. The apparatus of claim 3 wherein said protective coating of said inorganic aluminum compound is selected from the group consisting of an oxide of aluminum and aluminum nitride.

11. The apparatus of claims 10 wherein said polymeric dielectric material comprises a polyimide material.

12. The apparatus of claim 2 wherein said protective coating has a maximum coating thickness not exceeding about 10 microns.

13. In a semiconductor wafer processing apparatus wherein a wafer support, comprising aluminum or an aluminum alloy, has a polymeric dielectric material formed thereon to permit clamping of a semiconductor wafer to said wafer support by electrostatic charges, the improvement which comprises: a protective coating of uniform thickness formed over at least portions of said dielectric material, said protective coating of uniform thickness comprising an inorganic aluminum compound having a minimum coating thickness of at least about 1 micron and a maximum coating thickness of about 30 microns formed over said polymeric dielectric material to protect said polymeric dielectric material from attack by chemicals used in processing said semiconductor wafer.

14. The apparatus of claim 13 wherein said protective coating has a maximum coating thickness which does not exceed about 50% of the thickness of said polymeric dielectric material.

15. The apparatus of claim 13 wherein said protective coating is uniform in thickness over said dielectric material to provide uniformity in the strength of said electrostatic charges exerted on said semiconductor wafer.

16. The apparatus of claim 13 wherein the thermal coefficient of expansion of said protective coating:

does not vary from the thermal coefficient of expansion of said wafer support by more than about 5%; and b) does not vary from the thermal coefficient of expansion of said dielectric material by more than about 5%.

17. The apparatus of claim 13 wherein said protective coating has a minimum coating thickness of at least about 3 microns.

18. The apparatus of claim 13 wherein said protective coating has a maximum coating thickness of about 10 microns.

19. The apparatus of claim 13 wherein said protective coating has a resistivity ranging from about $10^{13}$ Ω cm. to about $10^{20}$ Ω cm. to permit holding of said electrostatic charge thereon during the electrostatic clamping of said semiconductor wafer and release of said electrostatic charge when said wafer is to be removed from said wafer support.

20. The apparatus of claim 13 wherein said aluminum compound is selected from the group consisting of an oxide of aluminum and aluminum nitride.

21. In a semiconductor wafer processing apparatus wherein an aluminum wafer support has a polymeric dielectric material formed thereon to permit clamping of a semiconductor wafer to said wafer support by electrostatic charges, the improvement which comprises: a protective coating of uniform thickness selected from the group consisting of aluminum oxide and aluminum nitride formed over at least portions of the surface of said polymeric dielectric material to protect said polymeric dielectric material from attack by chemicals used in processing said semiconductor wafer.

22. The apparatus of claim 21 wherein said polymeric dielectric material comprises a polyimide material.

23. The apparatus of claim 21 wherein said protective coating comprises aluminum oxide formed over the entire surface of said polymeric dielectric material.

24. In a semiconductor wafer processing apparatus wherein an aluminum wafer support has formed thereon a polyimide dielectric material with an electrode embedded therein comprising an electrostatic clamping structure to permit clamping of a semiconductor wafer to said wafer support by electrostatic charges, the improvement which comprises: a protective coating of uniform thickness of aluminum oxide formed over at least portions of the surface of said polyimide dielectric material to protect said polyimide dielectric material from attack by chemicals used in processing said semiconductor wafer.

\* \* \* \* \*